United States Patent
Moon et al.

(10) Patent No.: US 11,003,072 B2
(45) Date of Patent: May 11, 2021

(54) MASK SUBSTRATE INSPECTION SYSTEM

(71) Applicant: Samsung Display Co., Ltd., Yongin-Si (KR)

(72) Inventors: Seunghyun Moon, Hwaseong-si (KR); Dongwook Yang, Suwon-si (KR); Hyundae Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 88 days.

(21) Appl. No.: 16/532,389

(22) Filed: Aug. 5, 2019

(65) Prior Publication Data

US 2020/0096861 A1    Mar. 26, 2020

(30) Foreign Application Priority Data

Sep. 20, 2018  (KR) ................. 10-2018-0113192

(51) Int. Cl.

| | |
|---|---|
| *G03F 1/84* | (2012.01) |
| *G01N 21/956* | (2006.01) |
| *G06T 7/00* | (2017.01) |
| *G06T 7/12* | (2017.01) |
| *G06T 7/13* | (2017.01) |
| *G06T 7/11* | (2017.01) |
| *G06T 7/162* | (2017.01) |
| *G06T 5/00* | (2006.01) |

(52) U.S. Cl.
CPC .......... *G03F 1/84* (2013.01); *G01N 21/95607* (2013.01); *G06T 5/009* (2013.01); *G06T 7/0006* (2013.01); *G06T 7/11* (2017.01); *G06T 7/12* (2017.01); *G06T 7/13* (2017.01); *G06T 7/162* (2017.01); *G01N 2021/95676* (2013.01)

(58) Field of Classification Search
CPC ... G03F 1/84; G06T 7/162; G06T 7/12; G06T 7/11; G06T 7/13; G06T 5/009; G06T 7/0006; G01N 21/95607; G01N 2021/95676
See application file for complete search history.

(56) References Cited

U.S. PATENT DOCUMENTS

| | | | |
|---|---|---|---|
| 6,941,027 B1 * | 9/2005 | Gallagher | G06T 5/008 382/274 |
| 2001/0048474 A1 * | 12/2001 | Yamazaki | H04N 5/2352 348/207.99 |
| 2003/0112339 A1 * | 6/2003 | Cahill | H04N 5/3572 348/218.1 |

(Continued)

FOREIGN PATENT DOCUMENTS

| | | |
|---|---|---|
| JP | 5097521 B2 | 12/2012 |
| KR | 10-0730111 B1 | 6/2007 |
| KR | 10-2010-0057266 A | 5/2010 |

(Continued)

*Primary Examiner* — David F Dunphy
(74) *Attorney, Agent, or Firm* — Innovation Counsel LLP

(57) ABSTRACT

A mask substrate inspection system includes a measurement target module, a camera module, and a control module. The measurement target module includes a mask substrate and a surface light source supplying a light to the mask substrate. The camera module generates image information of the mask substrate using the light from the surface light source. The control module determines whether defects are present in the mask substrate using the image information, without damaging the mask substrate.

20 Claims, 7 Drawing Sheets

(56) References Cited

U.S. PATENT DOCUMENTS

2009/0273843 A1* 11/2009 Raskar .............. G02B 27/0018
359/601
2009/0304276 A1* 12/2009 Noh .................. H04N 9/04515
382/167

FOREIGN PATENT DOCUMENTS

KR      10-1013071 B1    2/2011
KR      10-1053779 B1    8/2011

* cited by examiner

MASK SUBSTRATE INSPECTION SYSTEM

CROSS-REFERENCE TO RELATED APPLICATION

This U.S. non-provisional patent application claims priority under 35 U.S.C. § 119 of Korean Patent Application No. 10-2018-0113192 filed on Sep. 20, 2018, the content of which is hereby incorporated by reference in its entirety.

BACKGROUND

1. Field of Disclosure

The present disclosure relates to a system that inspects whether a mask substrate is defective.

2. Description of the Related Art

In general, a plurality of openings is defined through a mask substrate used to manufacture a display panel.

The openings defined through the mask substrate are required to have a constant size and shape and required to be arranged uniformly to provide the display panel having high quality.

In a conventional display panel, a portion of a mask substrate is inspected by a scanning electron microscope (SEM) to check the size, shape, and arrangement of the openings defined through the mask substrate. In using the scanning electron microscope (SEM), it is possible to inspect the mask substrate with high accuracy but it is not possible to inspect the whole area of the mask substrate. In addition, in using the scanning electron microscope (SEM), some portions of the mask substrate are damaged since only destructive inspection is possible.

SUMMARY

The present disclosure provides a mask substrate inspection system capable of inspecting a mask substrate entirely without damaging the mask substrate.

Embodiments of the inventive concept provide a mask substrate inspection system including a measurement target module, a camera module, and a control module.

The measurement target module includes a surface light source, a fixing member including a first glass substrate and a second glass substrate and disposed on the surface light source, and a mask substrate disposed between the first glass substrate and the second glass substrate and having a first resolution defined by a plurality of openings in the mask substrate.

The camera module disposed above the surface light source and the fixing member, receiving a light emitted from the surface light source, and comprising an image sensor having a second resolution higher than the first resolution.

The control module receives image information photographed by the camera module.

The control module divides an image corresponding to the received image information into a plurality of areas respectively corresponding to the plurality of openings and calculates a plurality of points having a highest brightness value respectively corresponding to the plurality of areas.

The control module generates corrected image information by adjusting an average brightness value of image information at a center portion of the mask substrate to be the same as an average brightness value of image information at an edge portion of the mask substrate.

A brightness per unit area of the light emitted from the surface light source may be the same from different portions of the surface light source.

The control module may calculate information corresponding to a plurality of boundary areas from the image information, each of the boundary areas surrounding a corresponding point of the plurality of points.

Each of the plurality of boundary areas may include a plurality of sub-areas. The control module calculates a plurality of brightness value graphs respectively corresponding to the plurality of boundary areas using a plurality of brightness values corresponding to the plurality of sub-areas. The control module may integrate the plurality of calculated brightness value graphs to calculate a plurality of size information respectively corresponding to the boundary areas.

The control module may calculate an average value of the plurality of size information and calculates deviation values between the average value and the plurality of calculated size information.

The control module may determine each of the boundary areas having the deviation value equal to or greater than a predetermined value among the plurality of boundary areas as abnormal areas.

The control module may determine each of the boundary areas having the deviation value equal to or smaller than a predetermined value among the plurality of boundary areas as normal areas.

The control module may divide each of the boundary areas into a plurality of sub-areas. The control module calculates information corresponding to a plurality of shape areas respectively corresponding to the plurality of openings using the sub-areas having a brightness value equal to or greater than a predetermined value among the plurality of the sub-areas. The control module calculates information corresponding to a plurality of reference areas, each of the reference areas having a same area as a corresponding shape area of the plurality of shape areas, and each of the plurality of reference areas has a circular shape.

Coordinates of a center of mass of each of the plurality of shape areas may coincide with coordinates of a center of mass of the corresponding one of the plurality of reference areas.

The control module may calculate an overlap-area value that is an area value of an overlap area in which each of the reference areas overlaps with the corresponding shape area among the plurality of shape areas.

The control module may determine the shape areas corresponding to the reference areas having the overlap-area value equal to or greater than a predetermined value as normal areas.

The control module may determine the shape areas corresponding to the reference areas having the overlap-area value equal to or smaller than the predetermined value as abnormal areas.

Each of the plurality of reference areas includes a plurality of non-overlap areas that is not overlapped with the corresponding shape area among the plurality of shape areas, and the control module may calculate a plurality of non-overlap-area values that are area values of the plurality of non-overlap areas.

The control module may calculate a position of a the non-overlap area of the plurality of non-overlap areas having a largest non-overlap-area value in one reference area among the reference areas.

The control module may determine that a defect occurs on a portion of the mask substrate, which corresponds to the non-overlap area having the largest non-overlap-area value.

The control module may store design information of the mask substrate. The control module may calculate information about a first axis and information about a second axis crossing the first axis. The control module may combine the information about the first axis and the information about the second axis with the received image information.

The control module may calculate a direction in which a line segment connecting at least some points of the plurality of points extends and compare the calculated direction with at least one of the first axis and the second axis.

If the calculated direction is substantially parallel to at least one of the first axis and the second axis, the control module determines that an arrangement state of openings corresponding to the at least some points among the plurality of openings is normal.

When the calculated direction forms an acute angle with at least one of the first axis and the second axis, the control module may determine that an arrangement state of openings corresponding to the at least some points among the plurality of openings is abnormal.

A distance between at least one of the first axis and the second axis and the plurality of points may be calculated, and the arrangement state of the plurality of openings may be determined through the calculated distance.

The second resolution is equal to or greater than about 100 times the first resolution and equal to or less than about 300 times the first resolution.

According to the above, the mask substrate inspection system may inspect the size of each of the openings defined through the mask substrate at one time.

In addition, the mask substrate inspection system may inspect the shape of each of the openings defined through the mask substrate at one time.

Further, the mask substrate inspection system may inspect the arrangement state of the openings defined through the mask substrate at one time.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
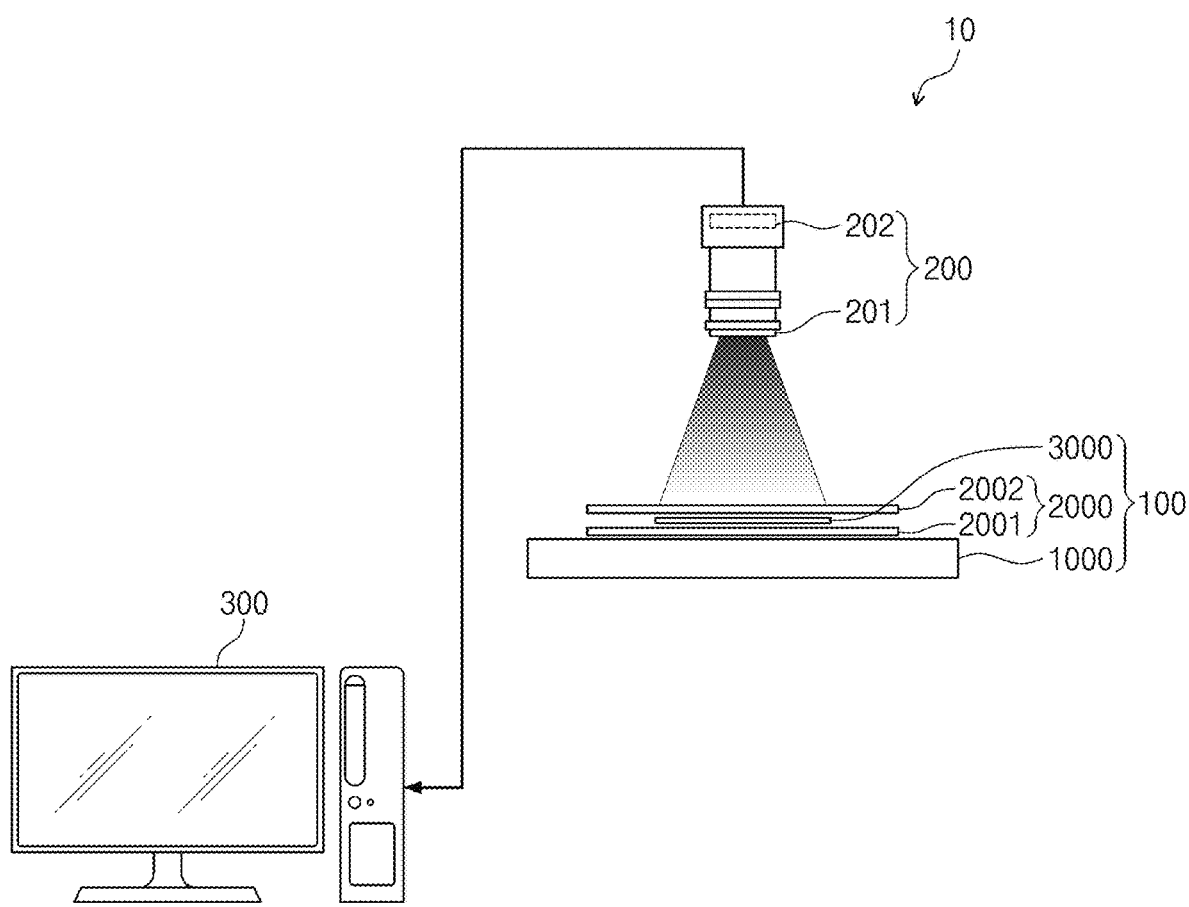
FIG. 1 is a schematic view of a mask substrate inspection system according to an exemplary embodiment of the present disclosure.

Hereinafter, the present invention will be explained in detail with reference to the accompanying drawings.

In the drawings, the thickness of layers, films, and regions are exaggerated for clarity. As used herein, the term "and/or" includes any and all combinations of one or more of the associated listed items.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 2:
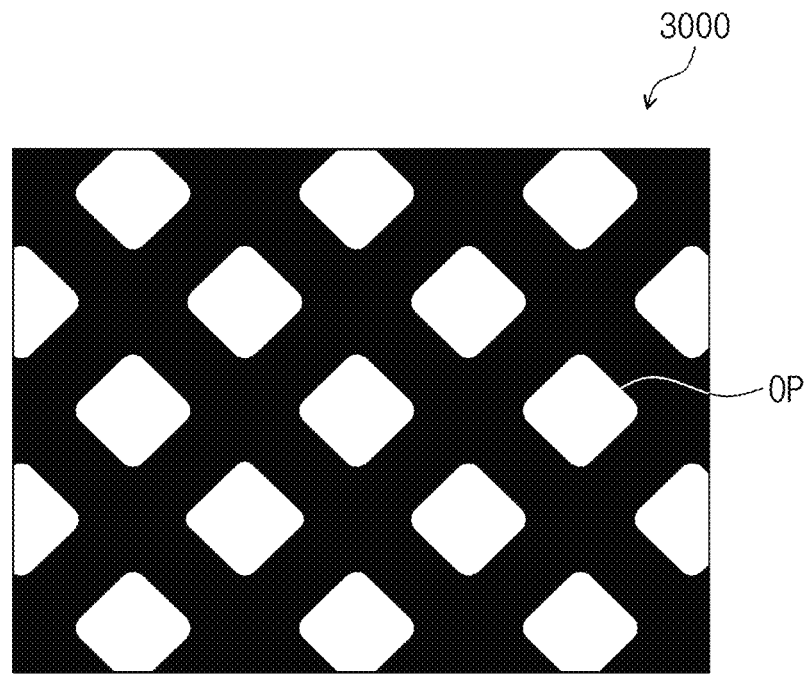
FIG. 2 is a schematic view showing a portion of a mask substrate shown in FIG. 1.

FIG. 1 is a view showing a mask substrate inspection system 10 according to an exemplary embodiment of the present disclosure. FIG. 2 is a view showing a portion of a mask substrate 3000 shown in FIG. 1.

The mask substrate inspection system 10 may include a measurement target module 100, a camera module 200, and a control module 300.

The measurement target module 100 may include a surface light source 1000, a fixing member 2000, and the mask substrate 3000.

The surface light source 1000 may emit a light to the fixing member 2000 and the mask substrate 3000. The surface light source 1000 may emit the light having a uniform brightness value. That is, the brightness per unit area of the light emitted from a portion of the surface light source 1000 may be the same as the brightness per unit area of the light emitted from other portions of the surface light source 1000.

The fixing member 2000 may be disposed on the surface light source 1000. The fixing member 2000 may accommodate the mask substrate 3000.

The fixing member 2000 may include a first glass substrate 2001 and a second glass substrate 2002.

The first glass substrate 2001 may be disposed on the surface light source 1000 to be substantially parallel to a light emitting surface of the surface light source 1000. The second glass substrate 2002 may be disposed on the first glass substrate 2001 to be substantially parallel to the light emitting surface of the surface light source 1000.

According to another embodiment of the present disclosure, each of the first and second glass substrates 2001 and 2002 may be replaced with a transparent plastic substrate.

The mask substrate 3000 may be accommodated in the fixing member 2000. In detail, the mask substrate 3000 may be disposed between the first glass substrate 2001 and the second glass substrate 2002. The mask substrate 3000 may include a metal material.

Referring to FIG. 2, a plurality of openings OP may be defined through the mask substrate 3000. The mask substrate 3000 may have a resolution (hereinafter, referred to as "first resolution") determined by the openings OP. For example, the first resolution may be determined depending on the number of the openings OP per unit area.

The camera module 200 may be disposed above the measurement target module 100. In detail, the camera module 200 may be disposed above the surface light source 1000 and the fixing member 2000.

The camera module 200 may receive the light that passes through the fixing member 2000 and the mask substrate 3000 among the lights emitted from the surface light source 1000.

The camera module 200 may include a lens 201 and an image sensor 202. The image sensor 202 may convert the light incident thereto through the lens 201 to an electrical signal. The image sensor 202 may be a CMOS sensor or a CCD sensor, however, it should not be limited thereto or thereby.

The image sensor 202 may have a resolution (hereinafter, referred to as "second resolution") higher than the first resolution. For example, the second resolution may be equal to or greater than about 100 times the first resolution and equal to or lower than about 300 times the first resolution. In the case where the second resolution is lower than about 100 times the first resolution, the image sensor 202 may not clearly recognize a shape of the openings OP of the mask substrate 3000. In the case where the second resolution is greater than about 300 times the first resolution, a manufacturing cost of the image sensor 202 becomes too high.

The camera module 200 may generate image information based on the received light and may transmit the generated image information to the control module 300.

The control module 300 may receive the image information from the camera module 200. The control module 300 may exchange information with the camera module 200 using a wired or wireless communication method.

The control module 300 may correct the received image information to generate the corrected image information. In addition, the control module 300 may check whether defects occur in the mask substrate 3000 using the corrected image information.

The control module 300 may include a central processing unit (CPU) and a memory (not shown). The memory may store a design information of the mask substrate 3000. The central processing unit (CPU) may perform an operation to compare the design information stored in the memory with the received image information. As another way, the central processing unit (CPU) may perform an operation to compare the design information stored in the memory with the corrected image information.

FIG. 1 shows a desktop computer as an example of the control module 300, however, the control module 300 should not be limited to the desktop computer. That is, the control module 300 may be a notebook computer, a smartphone, a tablet PC, or others.

The light emitted from the surface light source 1000 may reach an entire area of the mask substrate 3000. A portion of the light emitted from the surface light source 1000 is blocked by the mask substrate 3000, and the other portion of the light emitted from the surface light source 1000 may reach the camera module 200 after passing through the openings OP defined through the mask substrate 3000. The camera module 200 may generate the image information using the light reached thereto and may transmit the generated image information to the control module 300. The control module 300 operates the received image information to determine defects in size, shape, and arrangement of the openings OP of the mask substrate 3000.

Figure 3A:
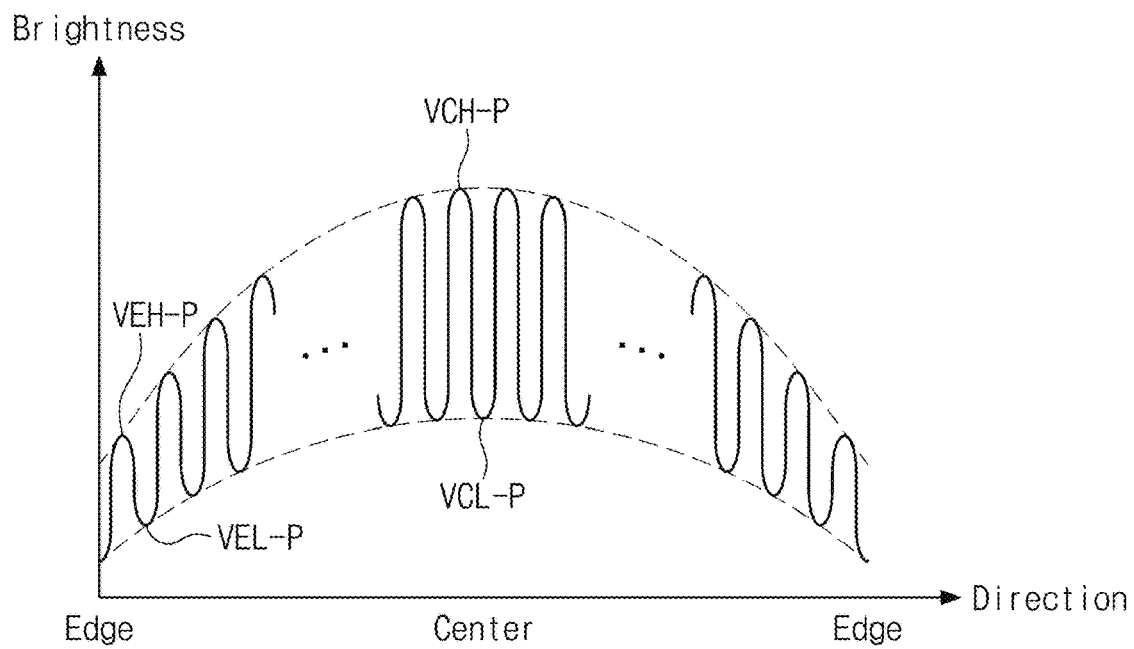
FIG. 3A is a graph corresponding to image information received by a control module shown in FIG. 1.
Figure 3B:
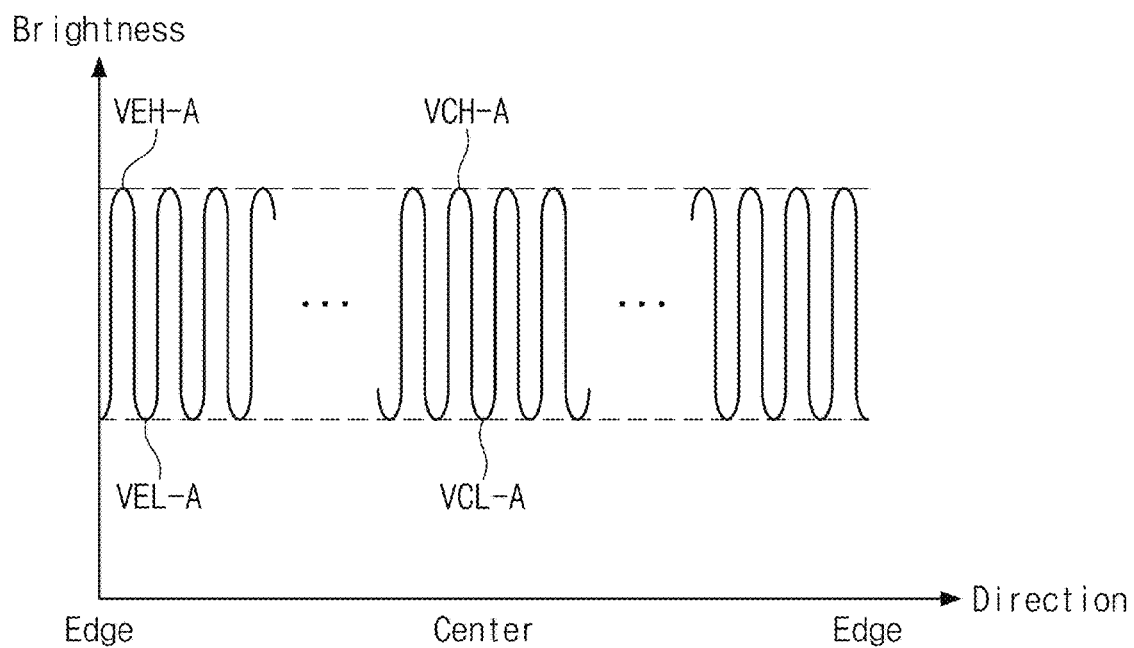
FIG. 3B is a graph corresponding to a corrected image generated by the control module shown in FIG. 1.

FIG. 3A is a view showing a graph corresponding to the image information received by the control module shown in FIG. 1. FIG. 3B is a view showing a graph corresponding to the corrected image information generated by the control module shown in FIG. 1.

Although the surface light source 1000 emits the light having entirely uniform brightness, the image sensor 202 of the camera module 200 recognizes that the brightness of the light emitted from a center portion of the surface light source 1000 is brighter than the brightness of the light emitted from an edge portion of the surface light source 1000 due to optical characteristics of the lens 201 of the camera module 200.

The graph of FIG. 3A shows the brightness of the light recognized by the image sensor 202 of the camera module 200.

In the graph, high values VCH-P and VEH-P may indicate maximum brightness values of the light after passing through the openings OP of the mask substrate 3000 among the lights emitted from the surface light source 1000. That is, portions corresponding to the high values VCH-P and VEH-P may correspond to portions of the mask substrate 3000, through which the openings OP are defined.

In FIG. 3A, the high values VCH-P and VEH-P may have brightness values different from each other. For example, a first center high value VCH-P corresponding to a center portion of the mask substrate 3000 may have the brightness value higher than the brightness value of a first edge high value VEH-P corresponding to an edge portion of the mask substrate 3000.

In FIG. 3A, low values VCL-P and VEL-P may have brightness values different from each other. For example, a first center low value VCL-P corresponding to the center portion of the mask substrate 3000 may have the brightness value higher than the brightness value of a first edge low value VEL-P corresponding to the edge portion of the mask substrate 3000.

In FIG. 3A, a difference between the first center high value VCH-P and the first center low value VCL-P may be greater than a difference between the first edge high value VEH-P and the first edge low value VEL-P.

As described above, the differences between the high values VCH-P and VEH-P and between the low values VCL-P and VEL-P occur because the image sensor 202 of the camera module 200 recognizes that the brightness of the light emitted from the center portion of the surface light source 1000 is brighter than the brightness of the light emitted from the edge portion of the surface light source 1000.

The control module 300 may correct the above-mentioned differences to generate the corrected image information.

FIG. 3B shows the graph corresponding to the corrected image information. A second center high value VCH-A may correspond to the first center high value VCH-P. A second edge high value VEH-A may correspond to the first edge high value VEH-P. A second center low value VCL-A may correspond to the first center low value VCL-P. A second edge low value VEL-A may correspond to the first edge low value VEL-P.

Different from FIG. 3A, the high values VCH-A and VEH-A and the low values VCL-A and VEL-A shown in FIG. 3B have a uniform distribution. That is, the control module 300 may correct the image information such that an average brightness value of the information corresponding to the center portion of the mask substrate 3000 becomes the same as an average brightness value of the information corresponding to the edge portion of the mask substrate 3000.

Since the above-described correction is performed by the control module 300, a reliable image information in which a distortion caused by the optical characteristics of the lens 201 of the camera module 200 is corrected may be generated.

The control module 300 may perform an additional operation based on the corrected image information to determine whether the mask substrate 3000 is defective.

Figure 4A:
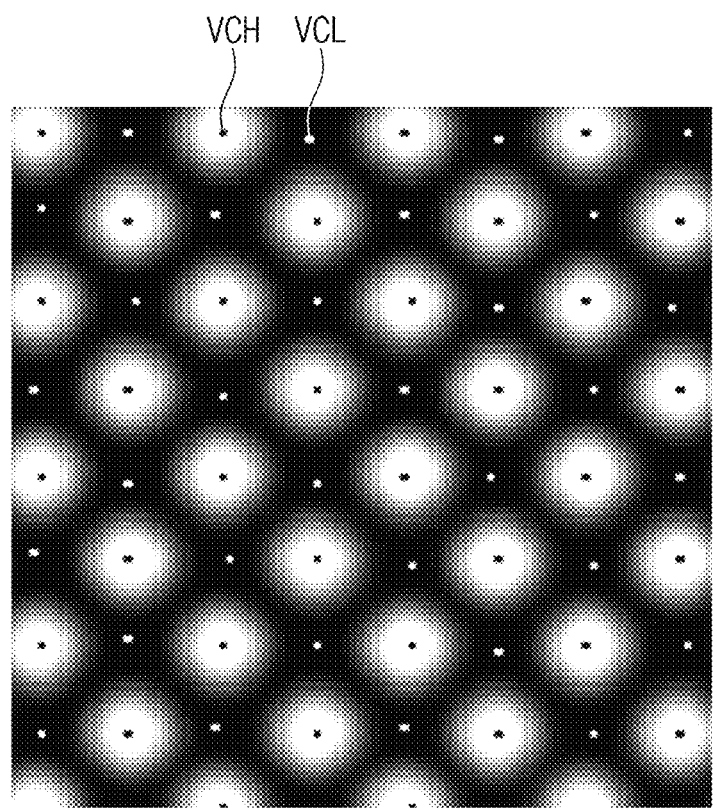
FIG. 4A is a schematic view showing the corrected image of FIG. 3B.
Figure 4B:
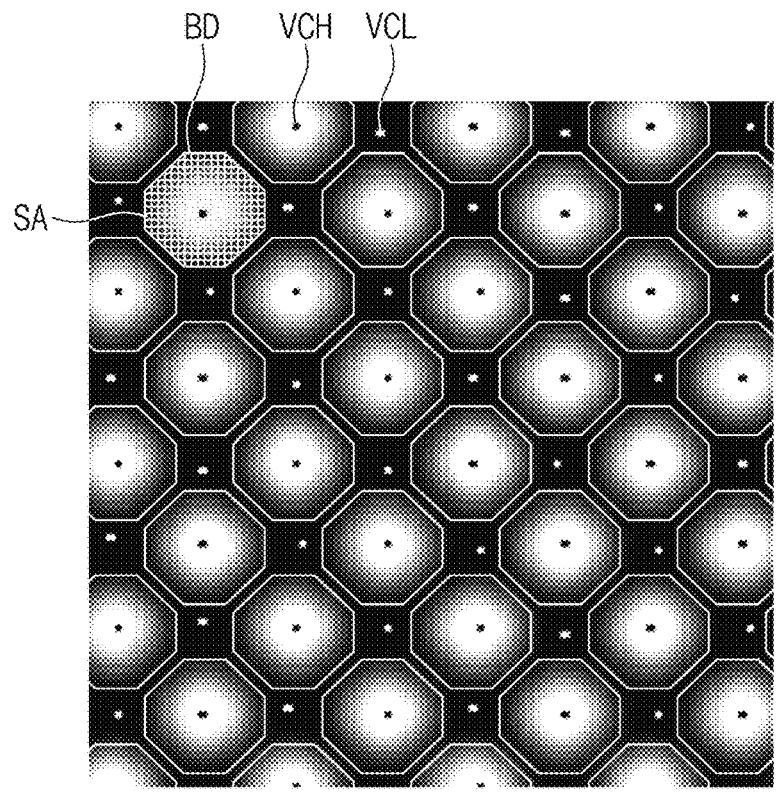
FIG. 4B is a schematic view showing boundary areas defined in the image of FIG. 4A.
Figure 4C:
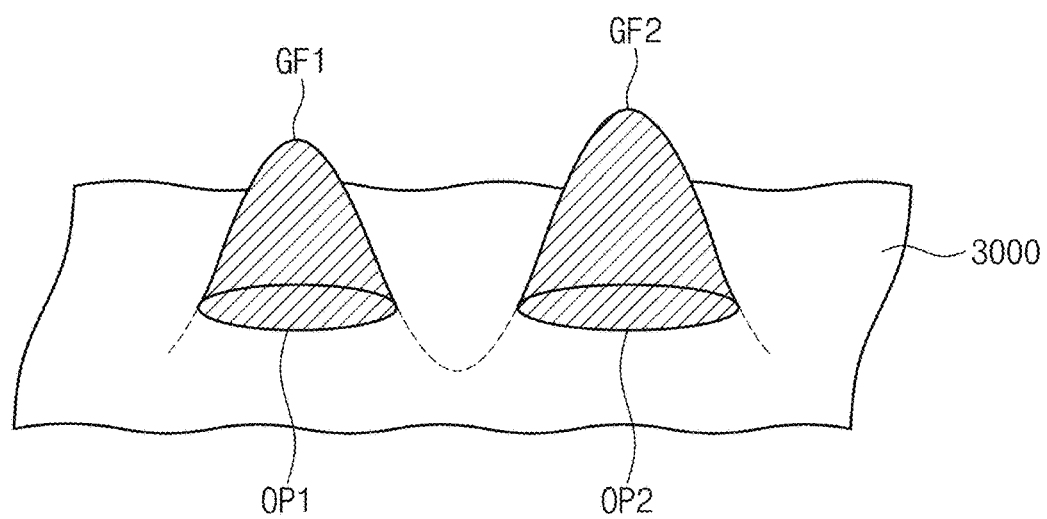
FIG. 4C is a schematic view showing graphs of brightness values corresponding to image information of two boundary areas adjacent to each other among the boundary areas shown in FIG. 4B.

FIG. 4A is a view showing the corrected image of FIG. 3B. FIG. 4B is a view showing boundary areas defined on the image of FIG. 4A. FIG. 4C is a view showing brightness value graphs GF1 and GF2 corresponding to image information of two boundary areas adjacent to each other among the boundary areas shown in FIG. 4B.

Referring to FIG. 4A, the control module 300 divides the image into a plurality of areas and calculates first points VCH having the largest brightness values in respective areas and second points VCL having the smallest brightness values in respective areas. In FIG. 4A, the first points VCH are represented by black dots, and the second points VCL are represented by white dots.

Then, the control module 300 calculates information about the boundary areas BD, each surrounding a corresponding first point of the first points VCH, using the calculated first and second points VCH and VCL.

Each of the boundary areas BD may include a plurality of sub-areas SA. The number of the sub-areas SA included in one boundary area BD may be determined by the resolution (i.e., the second resolution) of the image sensor 201 of the camera module 200.

The control module 300 may detect brightness values corresponding to the sub-areas SA and may calculate information corresponding to the brightness value graphs GF1 and GF2 shown in FIG. 4C using the detected brightness values.

FIG. 4C shows two openings OP1 and OP2 adjacent to each other and having different sizes among the openings OP of the mask substrate 3000.

As shown in FIG. 4C, when the size of the first opening OP1 is smaller than the size of the second opening OP2, a total brightness value of the boundary area BD corresponding to the first opening OP1 is smaller than a total brightness value of the boundary area BD corresponding to the second opening OP2.

Accordingly, the control module 300 integrates the calculated brightness value graphs GF1 and GF2 to calculate size information about the openings OP1 and OP2 respectively corresponding to the boundary areas BD.

In the exemplary embodiment of the present disclosure, the control module 300 may calculate an average value of the calculated size information and may calculate a deviation value between the average value and the size information with respect to each of the boundary areas BD.

In the exemplary embodiment of the present disclosure, the control module 300 may determine that the boundary areas having a deviation value equal to or greater than a predetermined value based on the average of the boundary areas are abnormal areas. Here, the term "abnormal area" may mean an area in which the size of the opening in the design information is remarkably different from the size of the opening OP of the mask substrate 3000.

In the exemplary embodiment of the present disclosure, the control module 300 may determine that the boundary areas having a deviation value equal to or less than the predetermined value based on the boundary areas are normal areas. Here, the term "normal area" may mean an area in which the size of the opening in the design information is similar to the size of the opening OP of the mask substrate 3000.

Figure 5A:
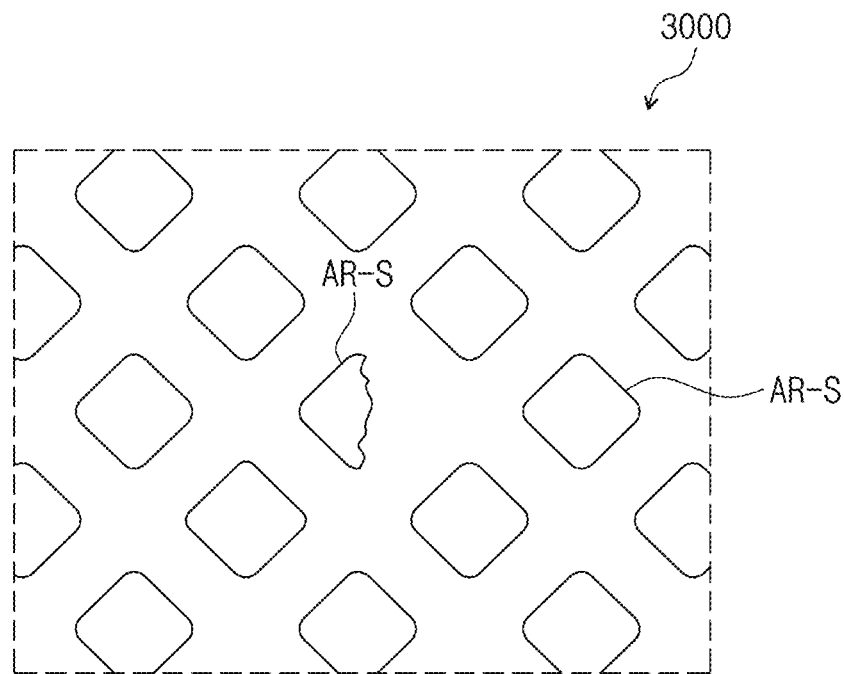
FIG. 5A is a schematic view showing shape areas calculated by the control module.
Figure 5B:
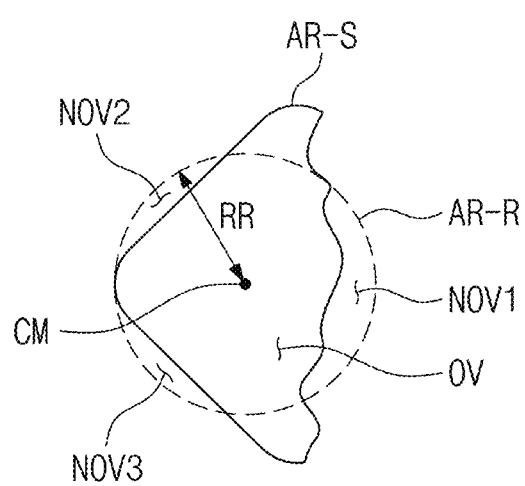
FIG. 5B is a schematic view showing one of the shape areas shown in FIG. 5A and a reference area corresponding to the shape area.

FIG. 5A is a view showing shape areas AR-S calculated by the control module 300. FIG. 5B is a view showing one of the shape areas AR-S shown in FIG. 5A and a reference area AR-R corresponding to the shape area.

The control module 300 may calculate information corresponding to the shape areas AR-S using the sub-areas SA having a brightness value equal to or greater than a predetermined value among the sub-areas SA included in each of the boundary areas BD. The shape areas AR-S respectively correspond to the openings OP of the mask substrate 3000. A shape of each of the shape areas AR-S may be understood as the shape of the corresponding opening OP among the openings OP of the mask substrate 3000.

In detail, since the sub-areas SA having the brightness value equal to or greater than the predetermined value among the sub-areas SA are areas defined by sensing the light after passing through the openings OP of the mask substrate 3000, the shape of the opening OP may be figured out using the above-mentioned sub-areas SA.

The control module 300 may calculate a center of mass CM and an area of each of the shape areas AR-S.

The control module 300 may calculate information about the reference areas AR-R. Each of the reference areas AR-R may have the same center of mass CM as that of a corresponding shape area AR-S. That is, coordinates of the center of mass of each of the reference areas AR-R may coincide with coordinates of the center of mass of each of the shape areas AR-S.

Each of the reference areas AR-R may have the same area as that of the corresponding shape areas AR-S.

In the exemplary embodiment of the present disclosure, each of the reference areas AR-R may have a circular shape, however, the shape of the reference areas AR-R should not be limited to the circular shape. Each of the reference areas AR-R may have an oval shape or a polygonal shape as needed. In the exemplary embodiment of the present disclosure, the shape of each of the reference areas AR-R may be the shape of the opening according to the design information stored in the control module 300.

Referring to FIG. 5B, the control module 300 may divide the reference area AR-R into an overlap area OV and non-overlap areas NOV1, NOV2, and NOV3.

The overlap area OV of the reference area AR-R overlaps with the shape area AR-S. Each of the non-overlap areas NOV1, NOV2, and NOV3 of the reference is where AR-R does not overlap with the shape area AR-S.

The control module 300 may calculate an overlap-area value that is an area value of the overlap area OV.

In the exemplary embodiment of the present disclosure, the control module 300 may determine that the shape areas AR-S corresponding to the reference areas AR-R having an overlap-area value equal to or greater than a predetermined value as the normal areas. The openings OP of the mask substrate 3000, which correspond to the shape areas AR-S determined as the normal areas, may be determined not to have defects in shape.

In the exemplary embodiment of the present disclosure, the control module 300 may determine that the shape areas AR-S corresponding to the reference areas AR-R having the overlap-area value equal to or smaller than the predetermined value as the abnormal areas. The openings OP of the mask substrate 3000, which correspond to the shape areas AR-S determined as the abnormal areas, may be determined to have defects in shape.

The control module 300 may calculate a non-overlap-area value that is an area value of each of the non-overlap areas NOV1, NOV2, and NOV3.

The control module 300 may determine the non-overlap area having the largest non-overlap-area value among the non-overlap areas NOV1, NOV2, and NOV3 in one reference area AR-R. In FIG. 5B, the first non-overlap area NOV1 is larger than the second non-overlap area NOV2 and the third non-overlap area NOV3.

In the exemplary embodiment of the present disclosure, the control module 300 may determine that the defects occur in a portion of the mask substrate 3000, which corresponds to the first non-overlap area NOV1 having the largest non-overlap-area value. Referring to FIG. 5B, the control module 300 may determine that the defects occur on a right side of the shape area AR-S.

That is, the control module 300 may first determine whether the defects occur using the overlap-area value and may specifically determine a direction in which the defects occur using the non-overlap-area values.

Figure 6:
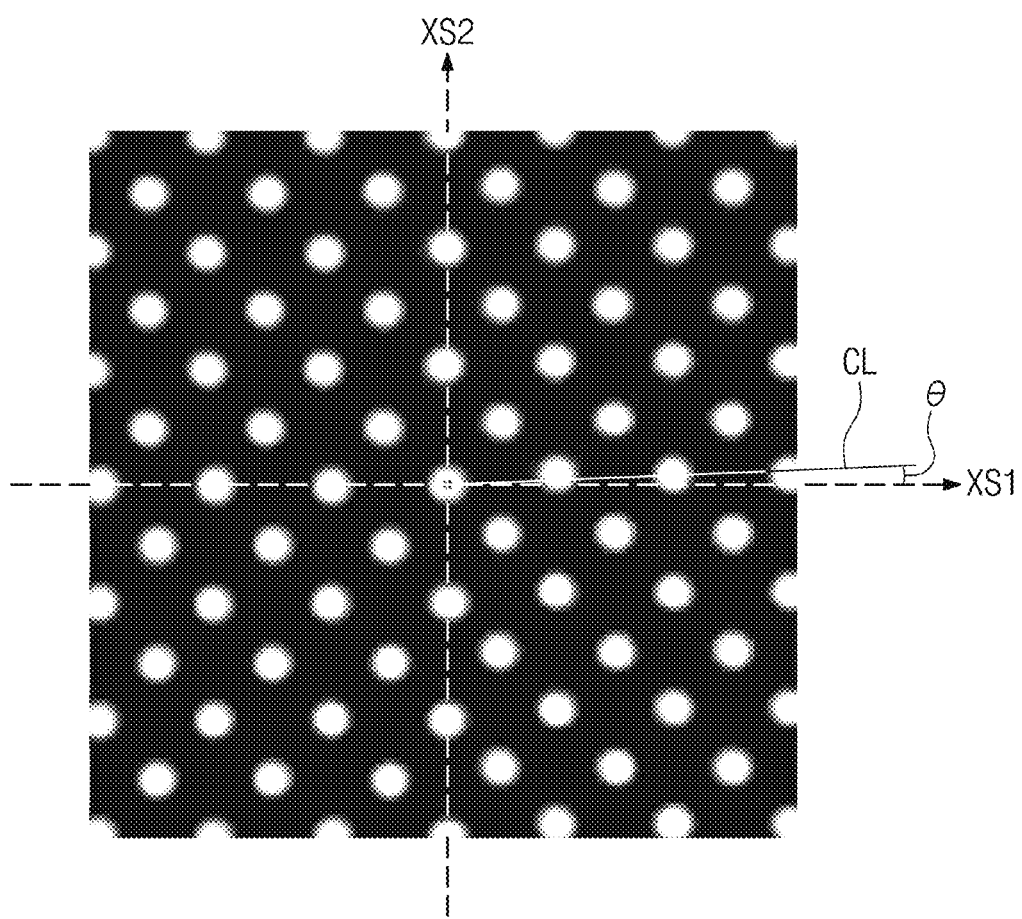
FIG. 6 is a schematic view showing a method of inspecting an arrangement state of openings of the mask substrate.

FIG. 6 is a view showing a method of inspecting an arrangement state of the openings OP of the mask substrate 3000.

FIG. 6 shows a corrected image as described in FIGS. 3A and 3B as a representative example.

The control module 300 may calculate first axis information and second axis information using the design information stored in the memory. A first axis XS1 may cross a second axis XS2. In FIG. 6, the first axis XS1 is substantially perpendicular to the second axis XS2, however, they should not be limited thereto or thereby.

Referring to FIGS. 4A and 6, the control module 300 may calculate a direction in which a line segment CL (or a "straight line") connecting some first points of the first points VCH extends and may compare the calculated direction with at least one of the first axis XS1 and the second axis XS2.

When the direction in which the line segment CL extends is substantially parallel to at least one of the first axis XS1 and the second axis XS2, the control module 300 may determine that the arrangement state of the openings OP corresponding to the first points VCH forming the line segment CL among the openings OP of the mask substrate 3000 is normal.

When the direction in which the line segment CL extends forms an acute angle θ with at least one of the first axis XS1 and the second axis XS2, the control module 300 may determine that the arrangement state of the openings OP corresponding to the first points VCH forming the line segment CL among the openings OP of the mask substrate 3000 is not normal.

In the exemplary embodiment of the present disclosure, the arrangement state of the openings OP may be determined based on a distance between at least one of the first axis XS1 and the second axis XS2 and a center of a white circular image (or a "portion having the largest brightness value"). Referring to FIG. 6, center portions (or portions having the largest brightness value) of the images positioned on a left side relative to the second axis XS2 are disposed on the first axis X1, however, center portions (or portions having the largest brightness value) of the images positioned on a right side relative to the second axis XS2 are disposed spaced apart from the first axis XS1. Through the above comparison, it is possible to determine whether the arrangement state of the openings OP is normal.

Although the exemplary embodiments of the present disclosure have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A mask substrate inspection system comprising:
   a measurement target module comprising a surface light source, a fixing member comprising a first glass substrate and a second glass substrate and disposed on the surface light source, and a mask substrate disposed between the first glass substrate and the second glass substrate and having a first resolution defined by a plurality of openings in the mask substrate;
   a camera module disposed above the surface light source and the fixing member, receiving a light emitted from the surface light source, and comprising an image sensor having a second resolution higher than the first resolution; and
   a control module receiving image information photographed by the camera module,
   wherein the control module divides an image corresponding to the received image information into a plurality of areas respectively corresponding to the plurality of openings, calculates a plurality of points having a highest brightness value respectively corresponding to the plurality of areas,
   wherein the control module generates corrected image information by adjusting an average brightness value of image information at a center portion of the mask substrate to be the same as an average brightness value of image information at an edge portion of the mask substrate.

2. The mask substrate inspection system of claim 1, wherein a brightness per unit area of the light emitted the surface light source is the same from different portions of the surface light source.

3. The mask substrate inspection system of claim 1, wherein the control module calculates information corresponding to a plurality of boundary areas from the image information, each of the boundary areas surrounds a corresponding point of the plurality of points.

4. The mask substrate inspection system of claim 3, wherein each of the plurality of boundary areas comprises a plurality of sub-areas, the control module calculates a plurality of brightness value graphs respectively corresponding to the plurality of boundary areas using a plurality of brightness values corresponding to the plurality of sub-areas, and the control module integrates the plurality of calculated brightness value graphs to calculate a plurality of size information respectively corresponding to the boundary areas.

5. The mask substrate inspection system of claim 4, wherein the control module calculates an average value of the plurality of size information and calculates deviation values between the average value and the plurality of calculated size information.

6. The mask substrate inspection system of claim 5, wherein the control module determines each of the plurality of boundary areas having the deviation value equal to or greater than a predetermined value among the plurality of boundary areas as abnormal areas.

7. The mask substrate inspection system of claim 5, wherein the control module determines each of the plurality of boundary areas having the deviation value equal to or smaller than a predetermined value among the plurality of boundary areas as normal areas.

8. The mask substrate inspection system of claim 3, wherein the control module divides each of the plurality of boundary areas into a plurality of sub-areas, calculates information corresponding to a plurality of shape areas respectively corresponding to the plurality of openings using the sub-areas having a brightness value equal to or greater than a predetermined value among the plurality of the sub-areas, and calculates information corresponding to a plurality of reference areas, each of the reference areas having a same area as a corresponding shape area of the plurality of shape areas, and each of the plurality of reference areas having a circular shape.

9. The mask substrate inspection system of claim 8, wherein coordinates of a center of mass of each of the plurality of shape areas coincide with coordinates of a center of mass of the corresponding one of the plurality of reference areas.

10. The mask substrate inspection system of claim 9, wherein the control module calculates an overlap-area value that is an area value of an overlap area in which each of the reference areas overlaps with the corresponding shape area among the plurality of shape areas.

11. The mask substrate inspection system of claim 10, wherein the control module determines the shape areas corresponding to the reference areas having the overlap-area value equal to or greater than a predetermined value as normal areas.

12. The mask substrate inspection system of claim 10, wherein the control module determines the shape areas corresponding to the reference areas having the overlap-area value equal to or smaller than a predetermined value as abnormal areas.

13. The mask substrate inspection system of claim 10, wherein each of the plurality of reference areas comprises a plurality of non-overlap areas that is not overlapped with the corresponding shape area among the plurality of shape areas, and the control module calculates a plurality of non-overlap-area values that are area values of the plurality of non-overlap areas.

14. The mask substrate inspection system of claim 13, wherein the control module calculates a position of a the non-overlap area of the plurality of non-overlap areas having a largest non-overlap-area value in one reference area among the reference area.

15. The mask substrate inspection system of claim 14, wherein the control module determines that a defect occurs on a portion of the mask substrate, which corresponds to the non-overlap area having the largest non-overlap-area value.

16. The mask substrate inspection system of claim 1, wherein the control module stores design information of the mask substrate, calculates information about a first axis and information about a second axis crossing the first axis, and combines the information about the first axis and the information about the second axis with the received image information.

17. The mask substrate inspection system of claim 16, wherein the control module calculates a direction in which a line segment connecting at least some points of the plurality of points extends, and compares the calculated direction with at least one of the first axis and the second axis.

18. The mask substrate inspection system of claim 17 wherein, if the calculated direction is substantially parallel to at least one of the first axis and the second axis, the control module determines that an arrangement state of openings corresponding to the at least some points among the plurality of openings is normal, and when the calculated direction forms an acute angle with at least one of the first axis and the second axis, the control module determines that the arrangement state of openings corresponding to the at least some points among the plurality of openings is abnormal.

19. The mask substrate inspection system of claim 16, wherein a distance between at least one of the first axis and the second axis and the plurality of points is calculated, and the arrangement state of the plurality of openings is determined through the calculated distance.

20. The mask substrate inspection system of claim 1, wherein the second resolution is equal to or greater than about 100 times the first resolution and equal to or less than about 300 times the first resolution.

* * * * *